United States Patent [19]
Liaw et al.

[11] Patent Number: 5,843,816
[45] Date of Patent: Dec. 1, 1998

[54] INTEGRATED SELF-ALIGNED BUTT CONTACT PROCESS FLOW AND STRUCTURE FOR SIX TRANSISTOR FULL COMPLEMENTARY METAL OXIDE SEMICONDUCTOR STATIC RANDOM ACCESS MEMORY CELL

[75] Inventors: Jhon-Jhy Liaw, Taipei; Jin-Yuan Lee, Hsin-Chu, both of Taiwan

[73] Assignee: Taiwan Semiconductor Manufacturing Company, Ltd., Hsin-Chu, Taiwan

[21] Appl. No.: 901,646

[22] Filed: Jul. 28, 1997

[51] Int. Cl.[6] .............................................. H01L 21/8244
[52] U.S. Cl. .......................... 438/238; 438/296; 438/586
[58] Field of Search .................................... 438/238, 296, 438/297, 305, 384, 586, 637, 639

[56] References Cited

U.S. PATENT DOCUMENTS

| 5,290,728 | 3/1994 | Sato | 438/639 |
|---|---|---|---|
| 5,330,929 | 7/1994 | Pfiester | 487/52 |
| 5,394,358 | 2/1995 | Huang | 365/182 |
| 5,521,113 | 5/1996 | Hsue et al. | 438/238 |
| 5,580,806 | 12/1996 | Chang et al. | 438/586 |
| 5,681,778 | 10/1997 | Manning | 438/238 |
| 5,731,241 | 3/1998 | Jang et al. | 438/296 |

*Primary Examiner*—Chandra Chaudhari
*Attorney, Agent, or Firm*—George O. Saile; Stephen B. Ackerman; Graham S. Jones, II

[57] ABSTRACT

A method of forming a contact between a conductor and a substrate region in a MOSFET device is provided starting with forming a semiconductor substrate with a silicon oxide layer formed on the surface thereof. Then form a stack of a conductor material upon the surface of the silicon oxide layer and form a first dielectric layer upon the conductor material. Pattern the conductor stack into conductors. Form a butted contact pattern in the first dielectric layer by removal of the dielectric layer in at least one butted contact region. Form doped regions in the substrate self-aligned with the conductors. Form an etch stop layer over the device. Form a second dielectric layer over the device and pattern the second dielectric layer with contact openings therethrough down to the substrate and to the butted contact region. Employ the etch stop layer when patterning the second dielectric layer. Remove exposed portions of the etch stop layer subsequent to patterning the second dielectric layer. Form contacts to the substrate and the butted contact regions on the conductor through the contact openings.

18 Claims, 13 Drawing Sheets

INTEGRATED SELF-ALIGNED BUTT CONTACT PROCESS FLOW AND STRUCTURE FOR SIX TRANSISTOR FULL COMPLEMENTARY METAL OXIDE SEMICONDUCTOR STATIC RANDOM ACCESS MEMORY CELL

BACKGROUND OF THE INVENTION

1. Field of the Invention

This invention relates to MOSFET semiconductor memory integrated circuits devices and more particularly to improved full Complementary Metal Oxide Semiconductor (CMOS) Static random access memory (SRAM) memory cells.

2. Description of Related Art

Integrated circuit (IC) memory devices are made up of a plurality of memory cells. In general, one basic memory cell design is duplicated numerous times to form those cells. The basic cell design may be modified slightly from cell to cell, for example one cell may be a reversed image or complement of an adjacent cell, but the entire memory device can be described according to the basic cell design.

In the case of Static Random Access Memory (SRAM) devices, the basic cell is usually in one of two forms, either a six transistor (6T) cell or four transistor/two resistor (4T/2R) cell. Many conventional SRAMs using a 6T configuration have six transistors formed in a bulk semiconductor substrate such as single crystal silicon. That type of SRAM is usually embodied in a Complementary Metal Oxide Semiconductor (CMOS) technology, with four transistors being N-channel devices while the remaining two transistors are P-channel devices. A 6T SRAM device operates at relatively low power levels and the bulk transistors have good electrical characteristics, including high mobility and low threshold voltages. Also 6T SRAMs are relatively stable, having high immunity to cell errors, such as those caused by incident alpha particles. However, 6T SRAM cells formed of transistors in a bulk substrate require a large area because the transistors are formed next to one another in the substrate and are essentially in the same plane; which use of six bulk transistors imposes an undesirable lower limit on the cell size. Achieving the smallest cell size with the simplest process reduces the manufacturing costs, increases memory capacity, and increases the device performance without increasing the overall device size.

U.S. Pat. No. 5,394,358 of Huang for "SRAM Memory Cell with Tri-level Local Interconnect" shows a method of forming a 6T SRAM that reduces the number of local interconnections. However, these patents do not show the butted contact structure of the invention.

U.S. Pat. No. 5,330,929 of Pfiester et al. for "Method of Making a Six Transistor Static Random Access Memory Cell" shows a method of making a six transistor (6T) SRAM Cell. However, Pfiester et al. does not show the butted contact of this invention, but does include an SRAM cell and a method of forming a memory cell, wherein the memory cell may comprise an active region and a first layer. The active region include first, second and third segments. The first segment has an adjacent end and a distal end. The second segment, generally parallel to the first segment, has an adjacent end and a distal end. For the third segment, generally perpendicular to the first direction, the adjacent end of the first segment lies near an end of the third segment. The adjacent end of the second segment lies near the other end of the third segment. The first layer is shaped similarly to the active region except that the first layer does not lie over the first and second segments near the distal ends. This invention includes an SRAM cell and a method of forming the memory cell, wherein the memory cell comprises shared gate gate electrodes that overlap one another without electrically contacting each other.

DEFINITIONS

Self-Aligned Source/Drain Regions:
   Regions formed in a silicon crystal substrate by ion implanting using the gate electrode itself as a mask to align the source/drain regions to the gate electrode.

Self-Aligned Contact:
   A contact formed to a region of the substrate which is self-aligned with the polysilicon conductor structure of an MOS device.

Butted contact:
   In a silicon gate MOS device, a polysilicon conductor and the active device region "butt" up against each other but do not make direct electrical contact with each other. There is an indirect form of electrical contact between the polysilicon conductor layer and the substrate wherein the polysilicon conductor is aligned with the edge of the active-device region to which contact is to be made. A contact window is opened that overlaps the polysilicon conductor and the active device region of the substrate. Metal is deposited into the window to form an electrical contact between the conductor and the active device region.

SUMMARY OF THE INVENTION

In accordance with this invention, a method if provided for forming a contact between a conductor and a substrate region in a MOSFET device is made by the following steps. Form a semiconductor substrate with a silicon oxide layer formed on the surface thereof. Form a stack of a conductor material upon the surface of the silicon oxide layer and form a first dielectric layer upon the conductor material. Pattern the conductor stack into conductors. Form a butted contact pattern in the first dielectric layer by removal of the dielectric layer in at least one butted contact region. Form doped regions in the substrate self-aligned with the conductors. Form a second dielectric layer over the device and patterning the second dielectric layer with contact openings therethrough down to the substrate and to the butted contact region. Form contacts to the substrate and the butted contact regions on the conductor through the contact openings.

Preferably the method includes these steps. Form an etch stop layer over the device before forming the second dielectric layer; employ the etch stop layer when patterning the second dielectric layer; and remove exposed portions of the etch stop layer subsequent to patterning the second dielectric layer.

Preferably, form the first dielectric layer as a silicon dioxide cap.

Preferably, form a barrier layer in the contact openings prior to forming the contacts, and form the contacts on the surfaces of the barrier layer.

Preferably, form lightly doped regions in the substrate and then form spacer structures adjacent to the conductors prior to forming the doped regions in the substrate.

In accordance with another aspect of this invention a contact between a conductor and a substrate region in a MOSFET device is formed by the following steps. Form a semiconductor substrate with a silicon oxide layer formed on the surface thereof and Shallow Trench Isolation (STI)

regions in the surface of the substrate. Form a stack of a conductor material upon the surface of the silicon oxide layer and form a first dielectric layer upon the conductor material. Pattern the conductor stack into conductors with at least one thereof juxtaposed with a first STI region. Form a butted contact pattern in the first dielectric layer by removal of the dielectric layer in at least one butted contact region juxtaposed with an STI region. Form doped regions in the substrate self-aligned with the conductors with at least one butted with a the conductor to form a butted contact region. Form a second dielectric layer over the device and patterning the second dielectric layer with contact openings therethrough down to the substrate and to the butted contact region. Form contacts to the substrate and the butted contact regions on the conductor through the contact openings.

Preferably form an etch stop layer over the device before forming the second dielectric layer; employ the etch stop layer when patterning the second dielectric layer; and remove exposed portions of the etch stop layer subsequent to patterning the second dielectric layer.

Preferably, the first dielectric layer is a silicon dioxide cap.

Preferably, form a barrier layer in the contact openings prior to forming the contacts, and form the contacts on the surfaces of the barrier layer.

Preferably, form lightly doped regions in the substrate and then forming spacer structures adjacent to the conductors prior to forming the doped regions in the substrate.

Preferably, form the first dielectric layer as a silicon dioxide cap; form an etch stop layer over the device prior to forming the second dielectric layer, employ the etch stop layer when patterning the second dielectric layer; and remove exposed portions of the etch stop layer subsequent to patterning the second dielectric layer.

Preferably, form a barrier layer in the contact openings prior to forming the contacts, and forming the contacts on the surfaces of the barrier layer.

In accordance with still another aspect of this invention a MOSFET device with a contact between a conductor and a substrate region in the device includes the following features. A semiconductor substrate with a silicon oxide layer formed on the surface thereof has a stack of a conductor material formed upon the surface of the silicon oxide layer with a first dielectric layer upon the conductor material. The conductor stack is formed into conductors. A butted contact pattern is formed in the first dielectric layer with an absence of the dielectric layer in at least one butted contact region. There are doped regions formed in the substrate self-aligned with the conductors. A second dielectric layer is formed over the device patterned with contact openings therethrough down to the substrate and to the butted contact region. There are contacts to the substrate and the butted contact regions on the conductor formed through the contact openings.

Preferably, an etch stop layer is formed over the second dielectric layer except where the contacts are formed.

Preferably, the first dielectric layer is a silicon dioxide cap.

Preferably, there is a barrier layer in the contact openings forming a base for the contacts.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

For maximum density to be achieved in a six transistors Static Random Access Memory (6T SRAM) device, the cells must be laid out to have minimum size, i.e occupy as small an area as possible. But conventional device layouts make it difficult to shrink device size due to metal routing and the number of contacts. In accordance with the Self-Aligned BuTt Contact (SABTC) design and method of the present invention, that problem is overcome.

Achieving MOSFET's with low series resistance, in the S/D diffusion layer, in a 6T SRAM device represents a key issue which must be accomplished to realize high-performance CMOS devices. The use of a silicon nitride etch stop layer combined with a modified Self-Aligned Contact (SAC) process to form contacts including butted contacts, provides minimum resistance in the Source/Drain (S/D) regions while at the same time permitting achievement of higher packing densities in accordance with this invention.

Figure 1:
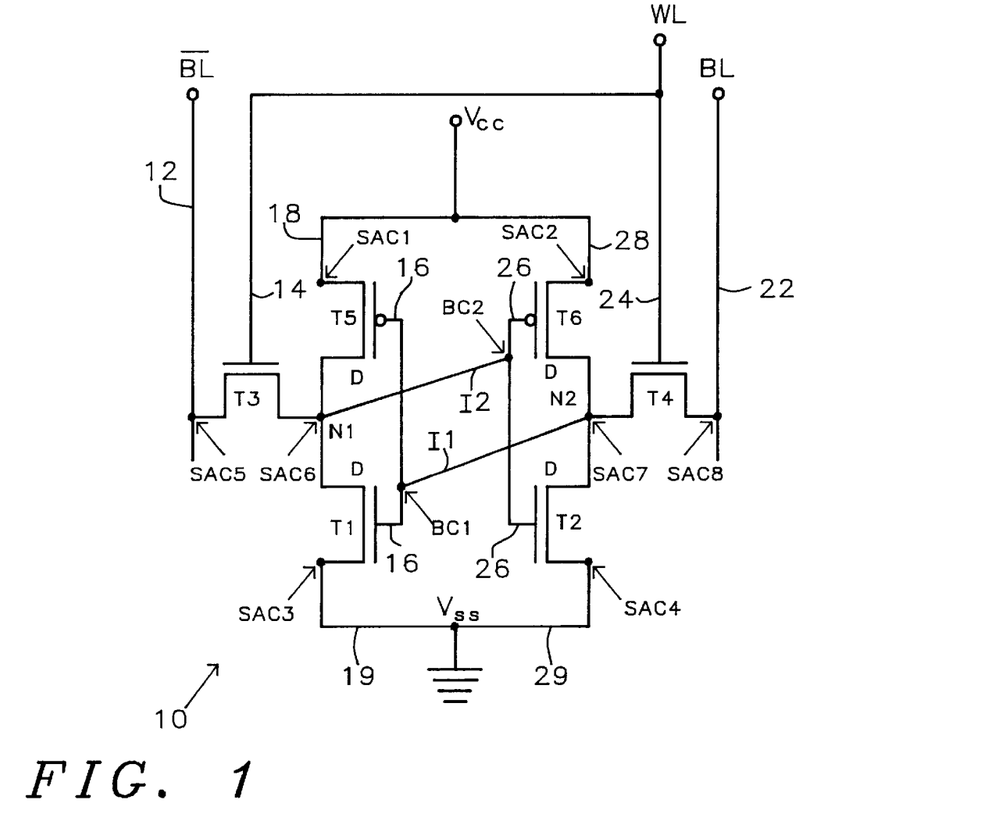
FIG. 1 shows a circuit diagram of a six transistor (6T) Static Random Access Memory (SRAM) cell 10 which includes a first storage node N1 and a second storage node N2 in accordance with this invention.

FIG. 1 shows a circuit diagram of a six transistor (6T) Static Random Access Memory (SRAM) cell 10 which includes a first storage node N1 and a second storage node N2 in accordance with this invention. A first pass transistor T3, a first latch transistor T1 and a first load transistor T5 are associated with the first storage node N1. A second pass transistor T4, a second latch transistor T2 and a second load transistor T6 are associated with the second storage node N2.

The gate electrodes for the first latch transistor T1 and the first load transistor T5 are connected via conductor line 16 to the second storage node N2. The gate electrodes for the second latch transistor T2 and the second load transistor T6 are connected via conductor line 26 to the first storage node N1. The gate electrodes for the pass transistors T3 and T4 are connected via lines 14 and 24, respectively, to the word line WL.

The source regions of load transistors T5 and T6 are electrically interconnected, as well as being connected to a $V_{cc}$ terminal via Self-Aligned Contacts SAC1 (via line 18) and SAC2 (via line 28) respectively.

The source regions of the latch transistors T1 and T2 are electrically interconnected, as well as being connected to a $V_{ss}$ terminal and connected together via Self-Aligned Contacts SAC3 (via line 19) and SAC4 (via line 29). The $V_{ss}$ terminal is at reference potential, when in operation.

The source/drain circuit of the pass transistor T3 is connected via Self-Aligned Contacts SAC5 and SAC6, respectively between the bit line BL bar (line 12) and node N1.

The source/drain circuit of the pass transistor T4 is connected via Self-Aligned Contacts SAC7 and SAC8, respectively between the node N2 and the bit line BL (line 22).

The pass and latch transistors T1, T2, T3, T4 are NMOS (N-channel) devices and the load transistors are PMOS (P-channel) T5, T6 devices.

There is a Self-Aligned BuTt Contact (SABTC) BC1 connected to the Node N2 and the conductor line 16 which interconnects the gate electrodes of the first latch transistor T1 and the first load transistor T5.

There is also a Self-Aligned BuTt Contact (SABTC) BC2 connected to the Node N1 and the conductor line 26 which interconnects to the gate electrodes of the first latch transistor T2 and the first load transistor T6.

On the one hand interconnection line I1 interconnects node N2 to Self-Aligned BuTt Contact (SABTC) BC1 and the conductor line 16. On the other hand, interconnection line I2 connects node N1 to Self-Aligned BuTt Contact (SABTC) BC2 and the conductor line 26.

Method of Forming Self-Aligned BuTt Contact (SABTC)

Figure 2A:
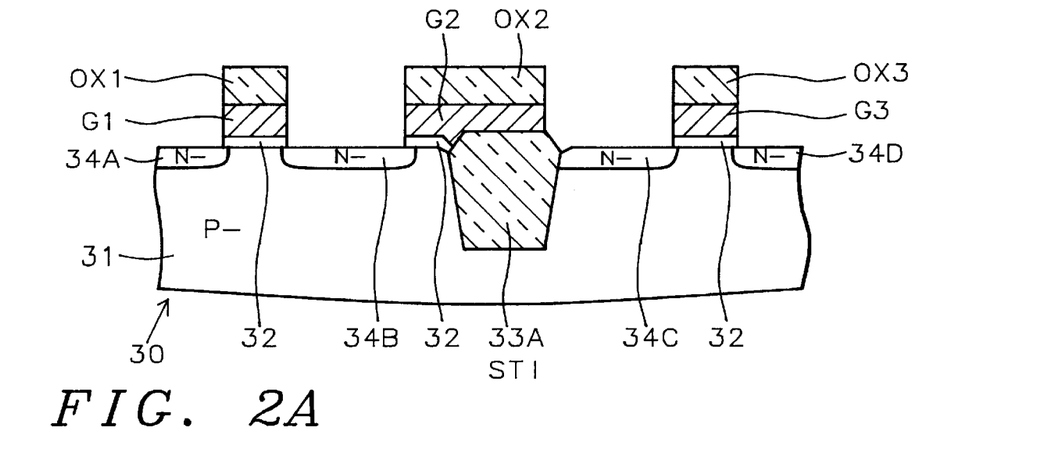
FIGS. 2A–2I, which are sections taken along line 2—2' in FIG. 4, illustrate a sequence of steps in accordance with the method of formation of a device in accordance with this invention.
Figure 2B:
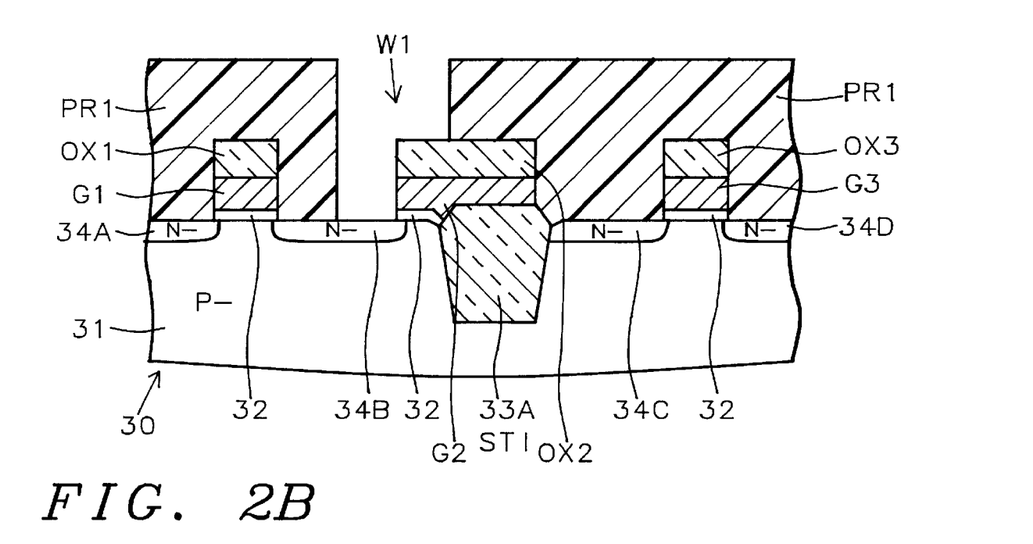
Figure 2C:
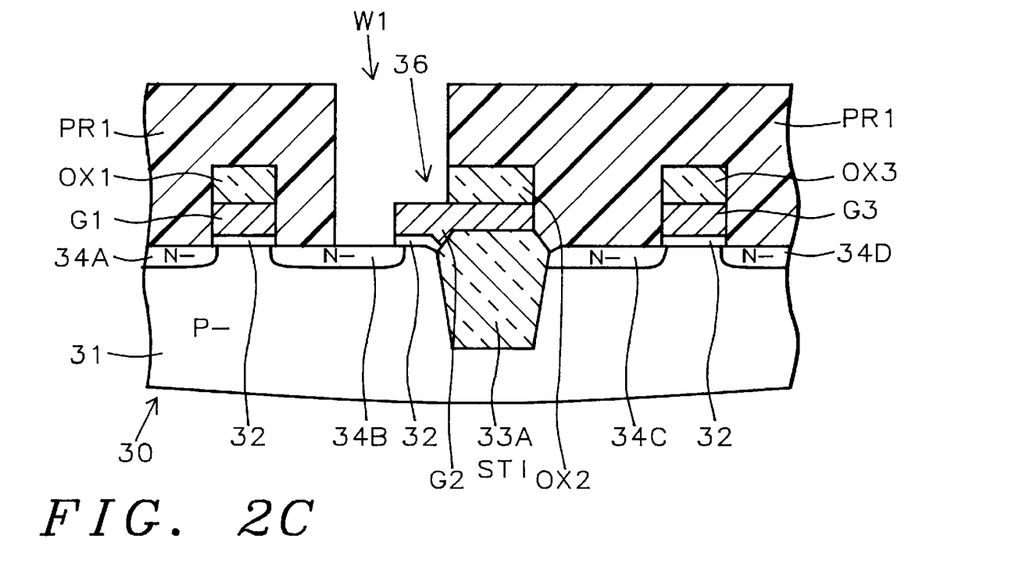
Figure 2D:
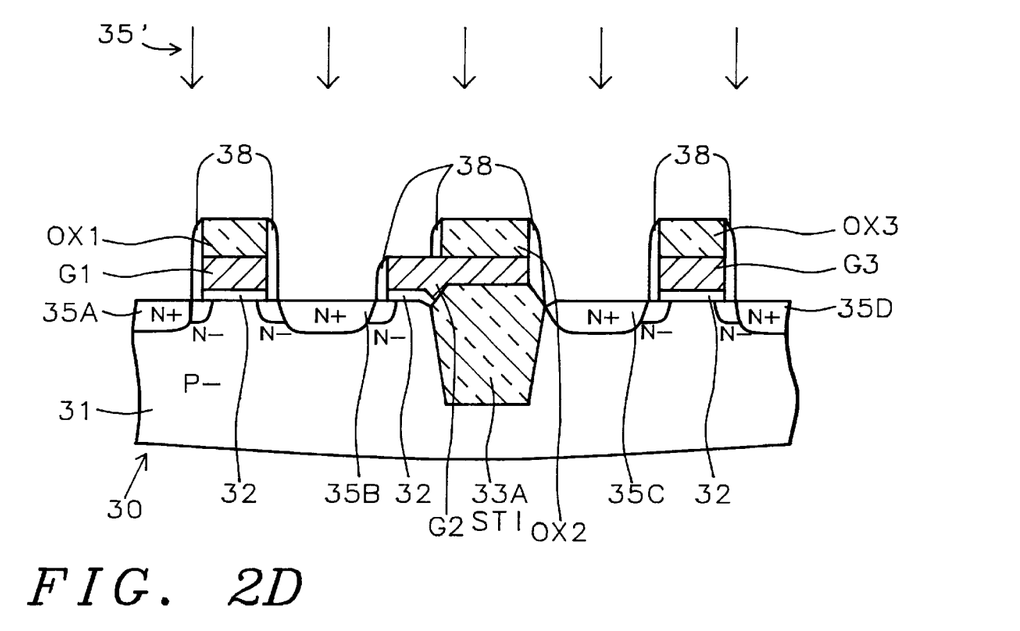
Figure 2E:
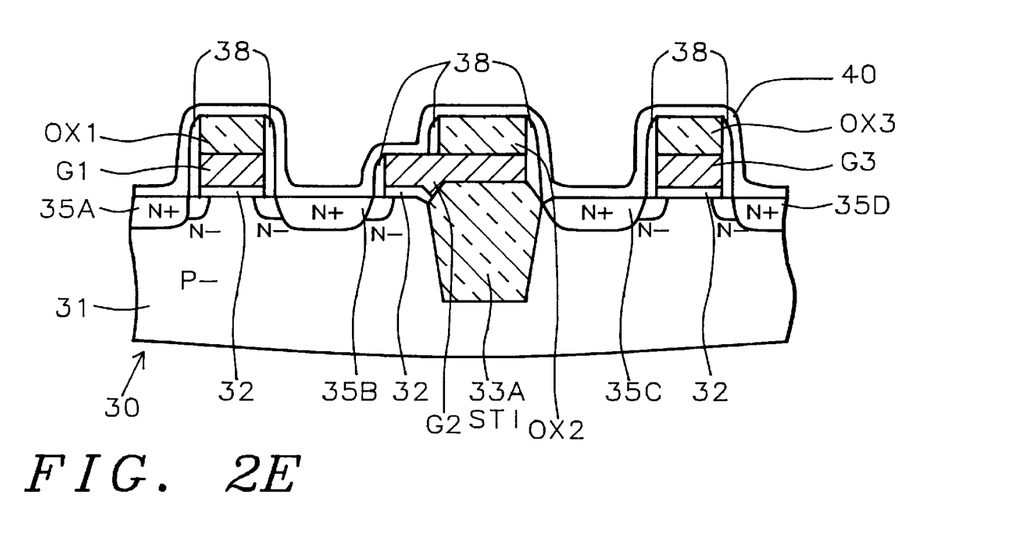
Figure 2F:
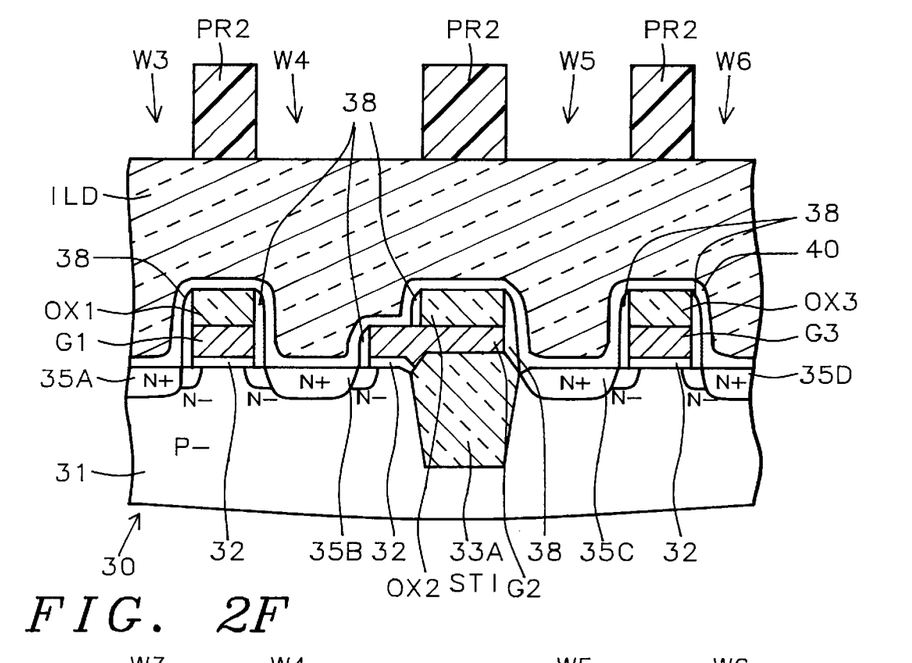
Figure 2G:
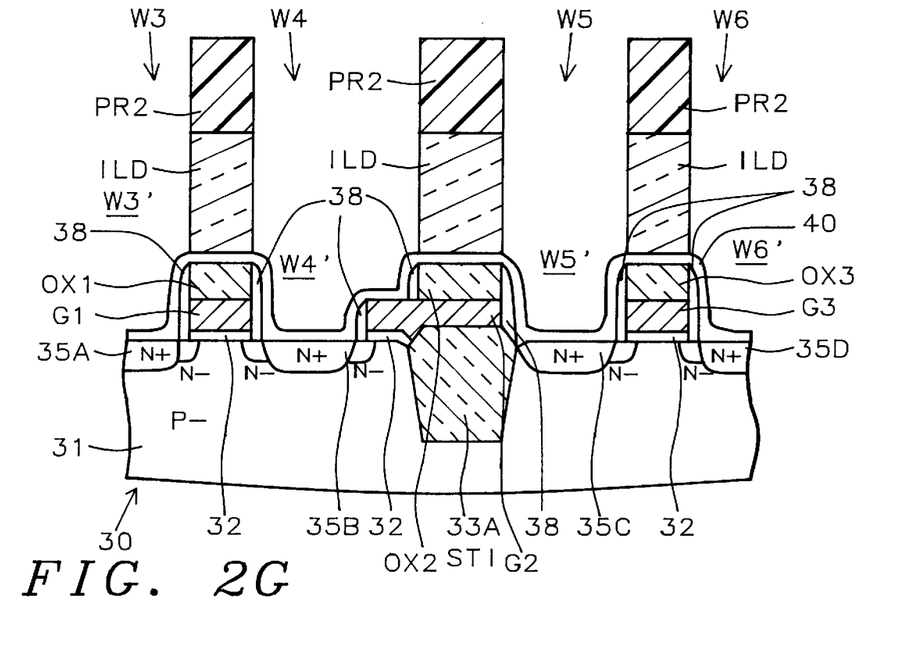
Figure 2H:
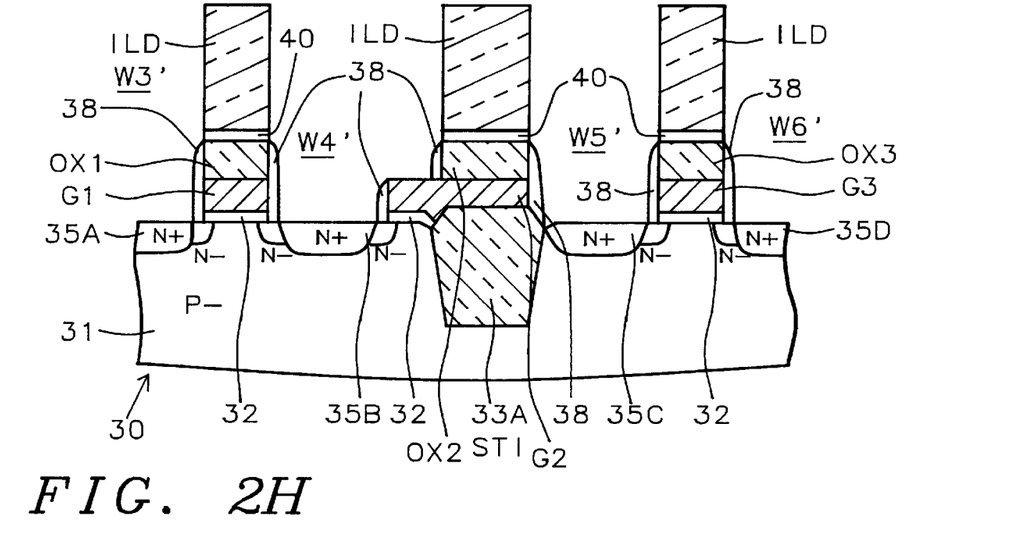
Figure 2I:
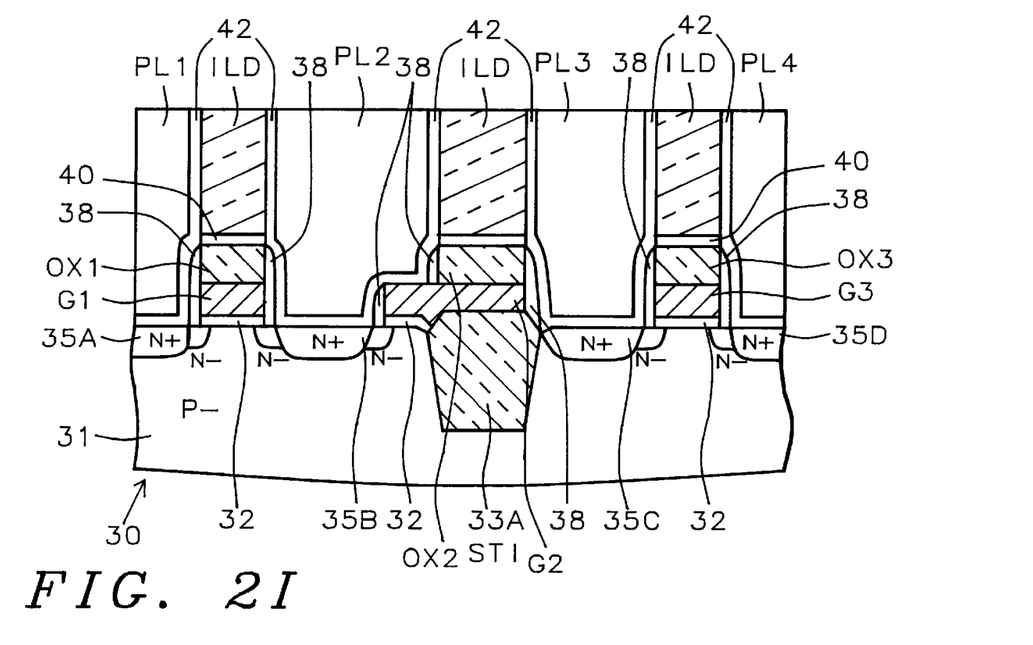
Figure 3A:
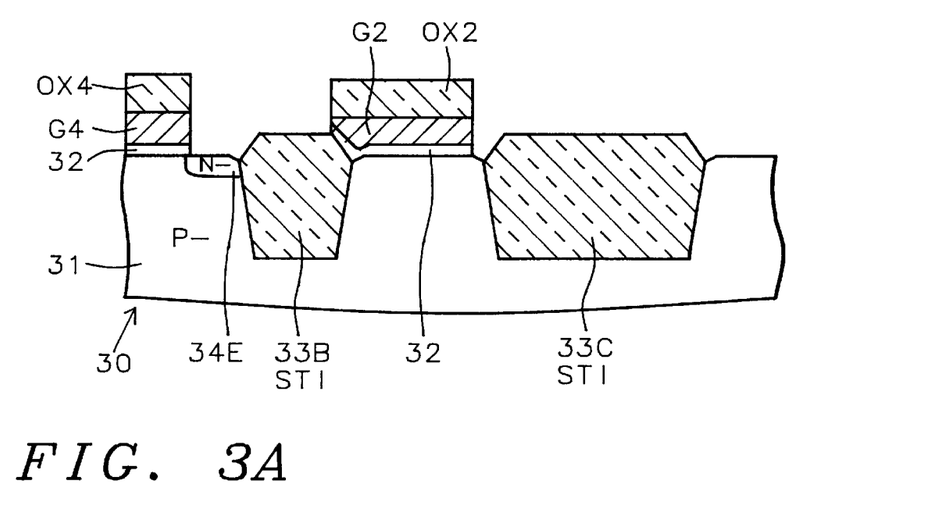
FIGS. 3A–3I which are sections taken along line 3—3' in FIG. 4 also illustrate the sequence of steps in accordance with the method of formation of a device in accordance with this invention.
Figure 3B:
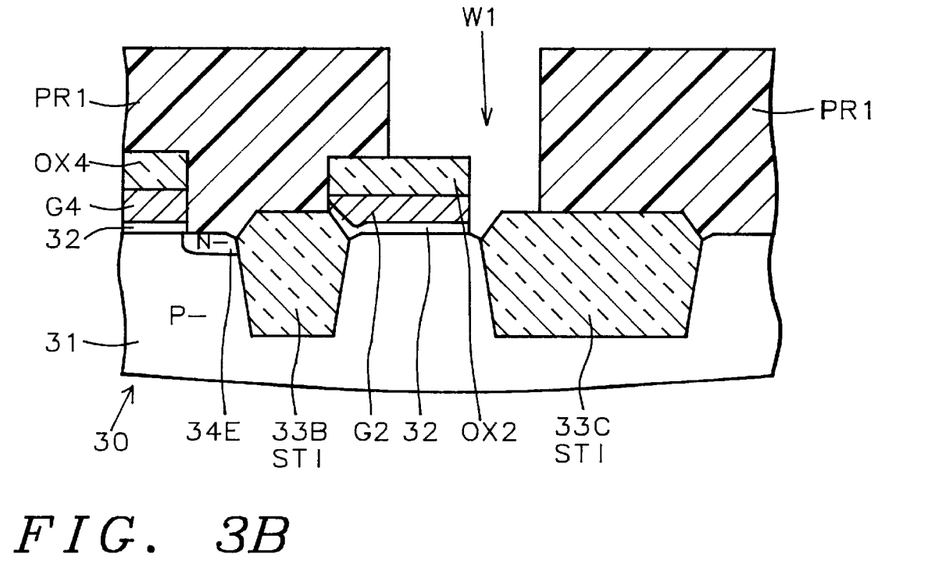
Figure 3C:
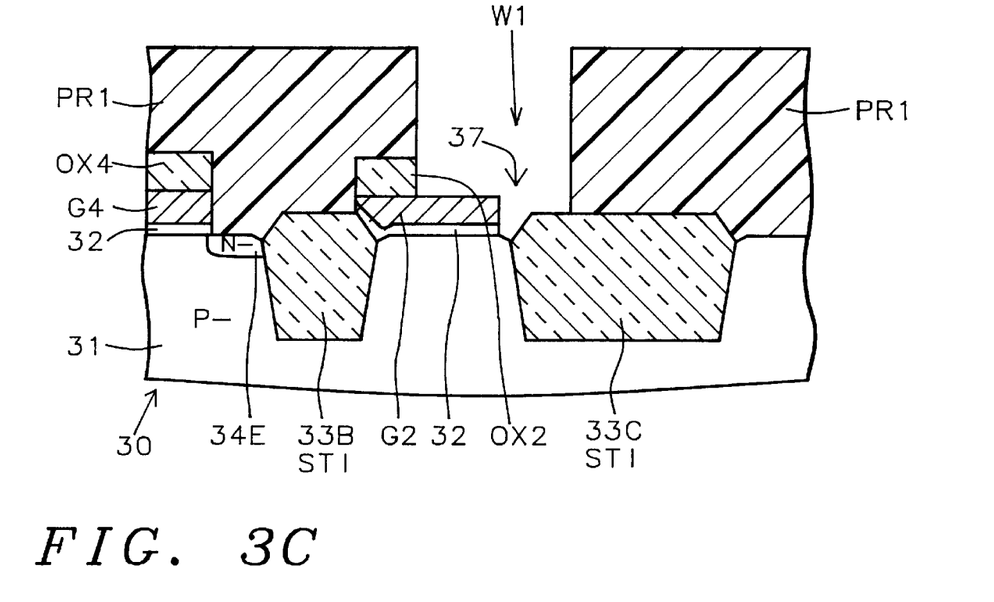
Figure 3D:
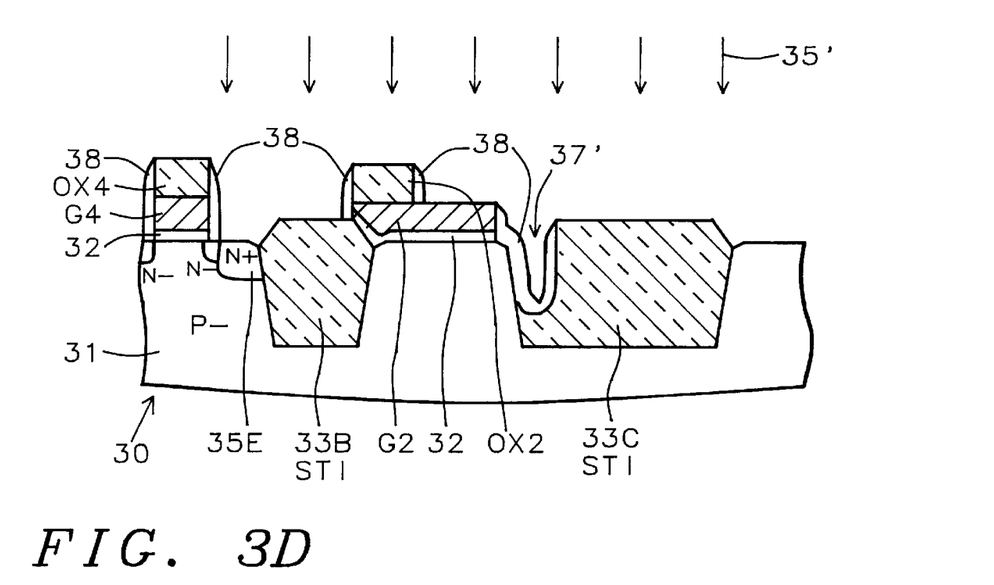
Figure 3E:
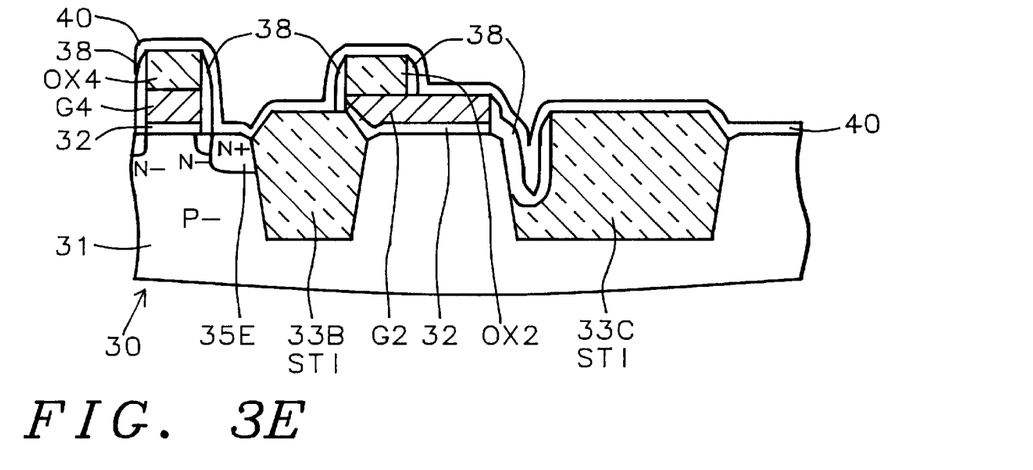
Figure 3F:
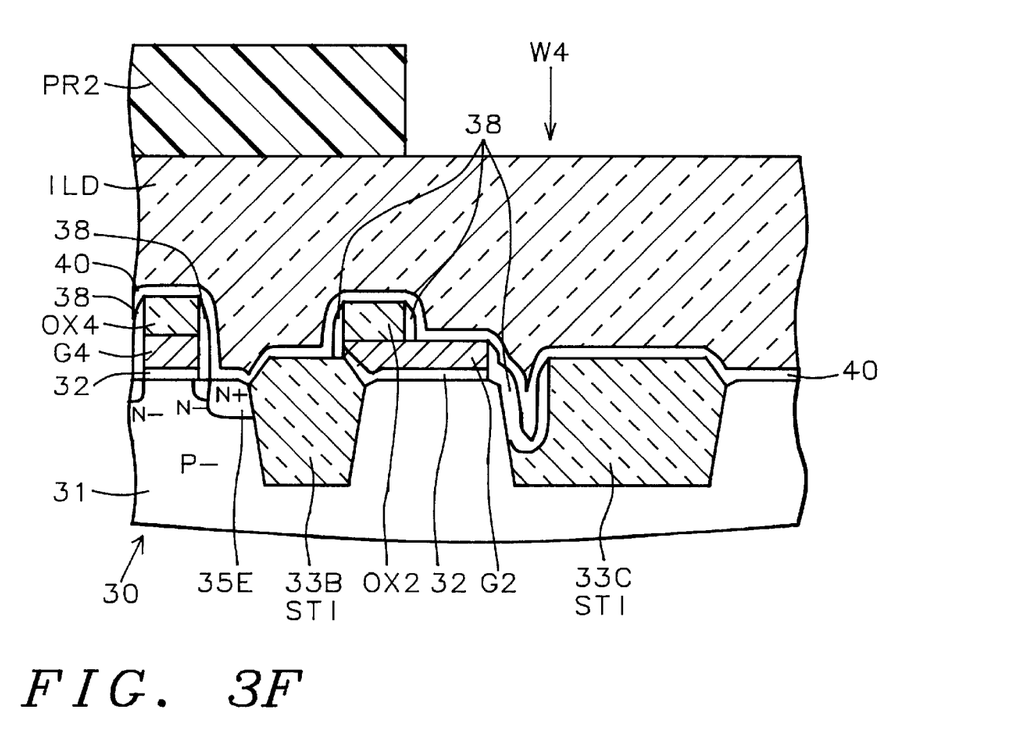
Figure 3G:
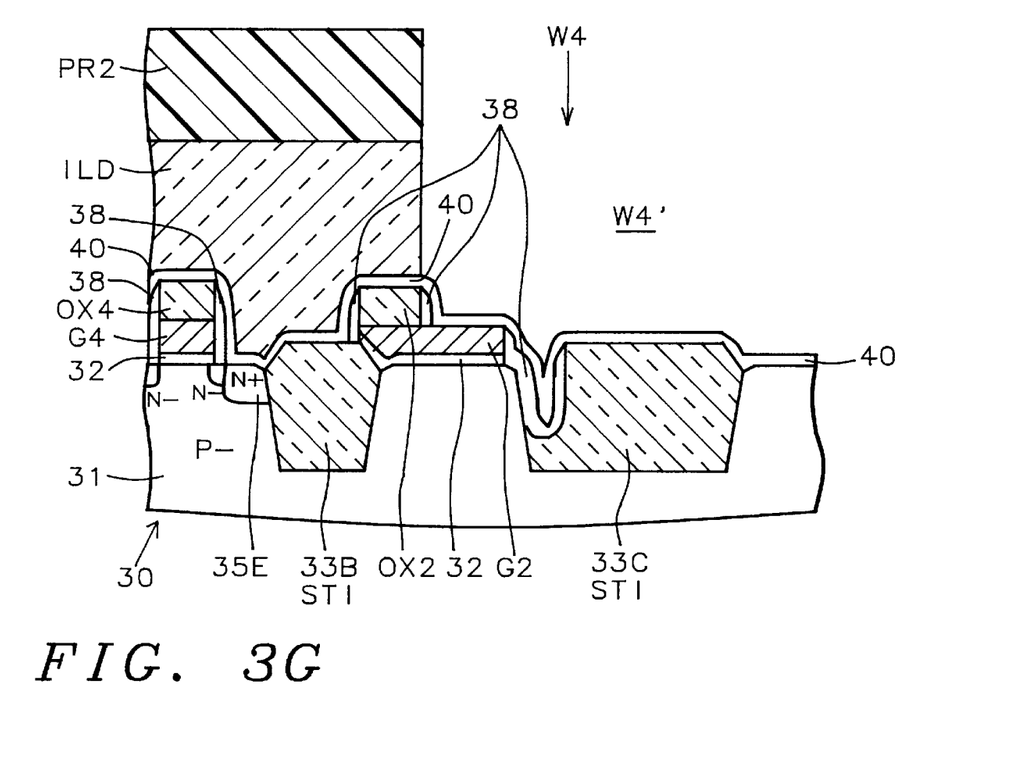
Figure 3H:
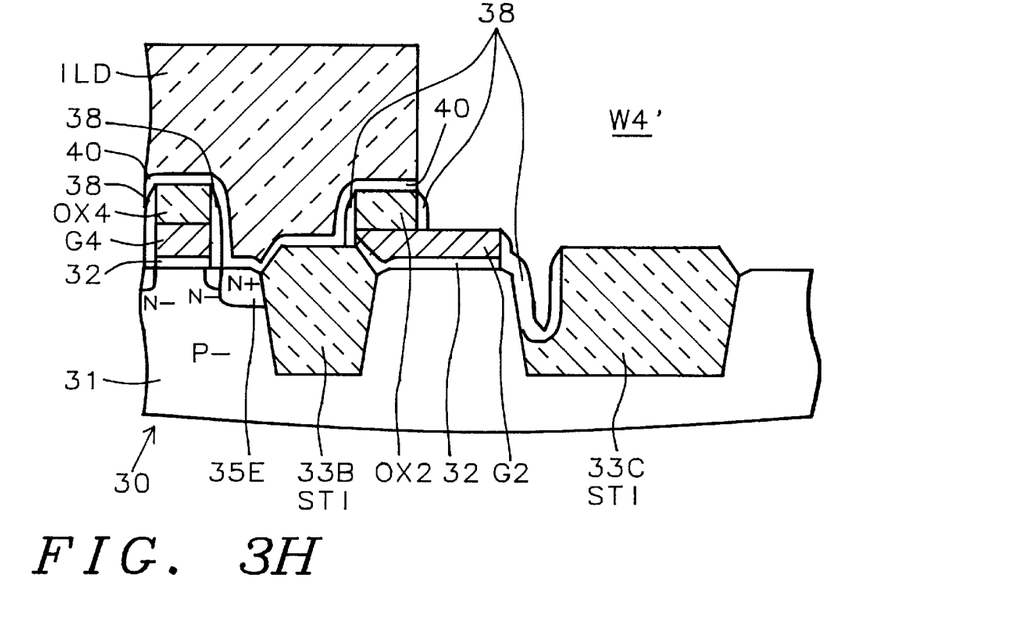
Figure 3I:
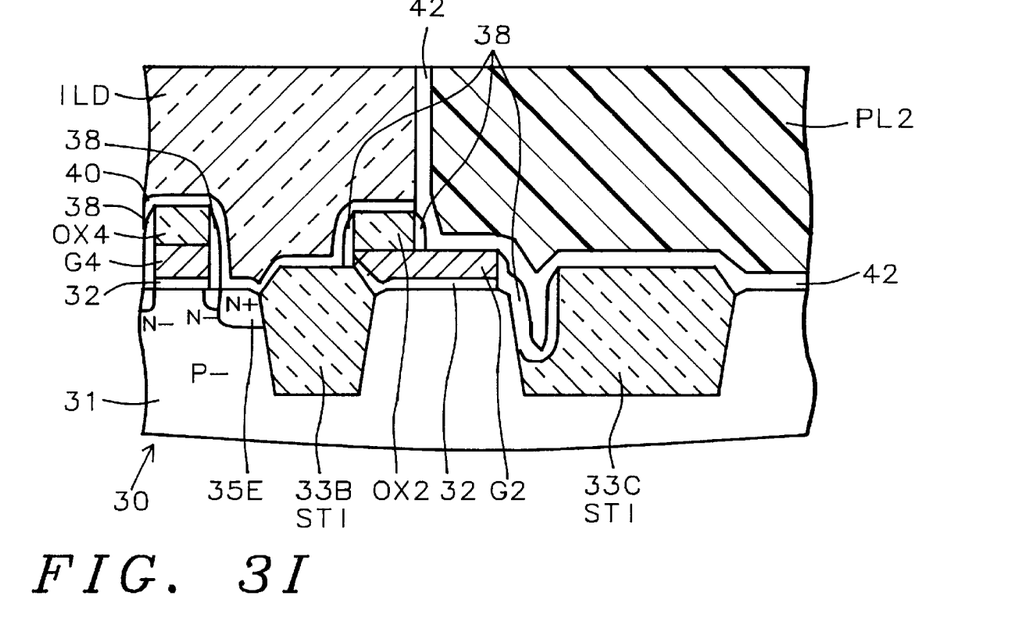
Figure 4:
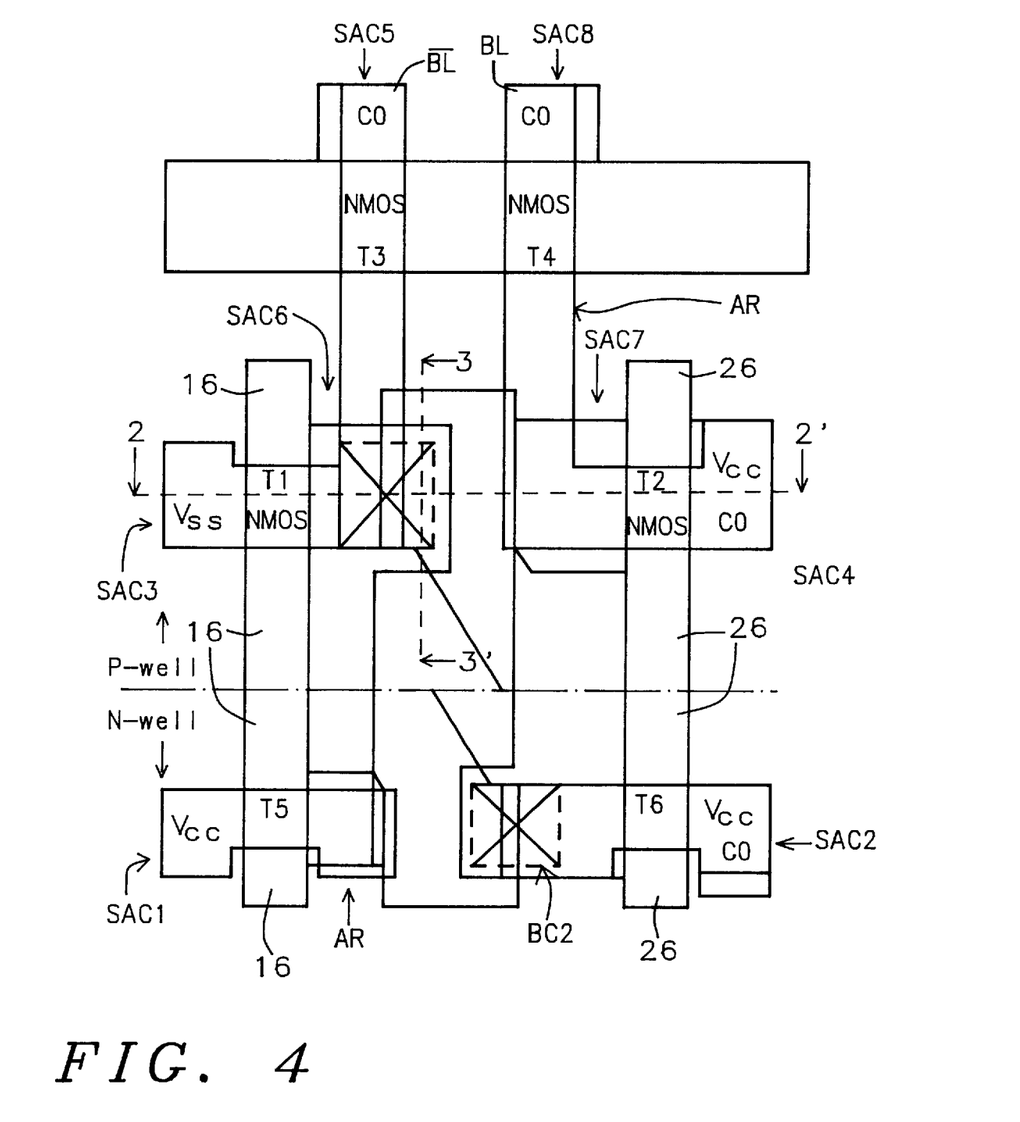
FIG. 4 is a plan view of a device in accordance with this invention.

The method of forming a device in accordance with the plan view seen in FIG. 4 as illustrated in FIGS. 2A–2I which are sections taken along line 2—2' in FIG. 4 and as illustrated in FIGS. 3A–3I which are sections taken along line 3—3' in FIG. 4 which is a plan view of a device in accordance with this invention.

Referring to FIGS. 2A and 3A, after performance of early steps preparatory to performance of the process of this invention is illustrated. Referring to the flow chart in FIGS. 5A and 5B, in step 50 in FIG. 5A, active regions AR in FIG. 4 are formed in a P- substrate 31 of device 30, as will be understood by those skilled in the art.

Figure 5A:
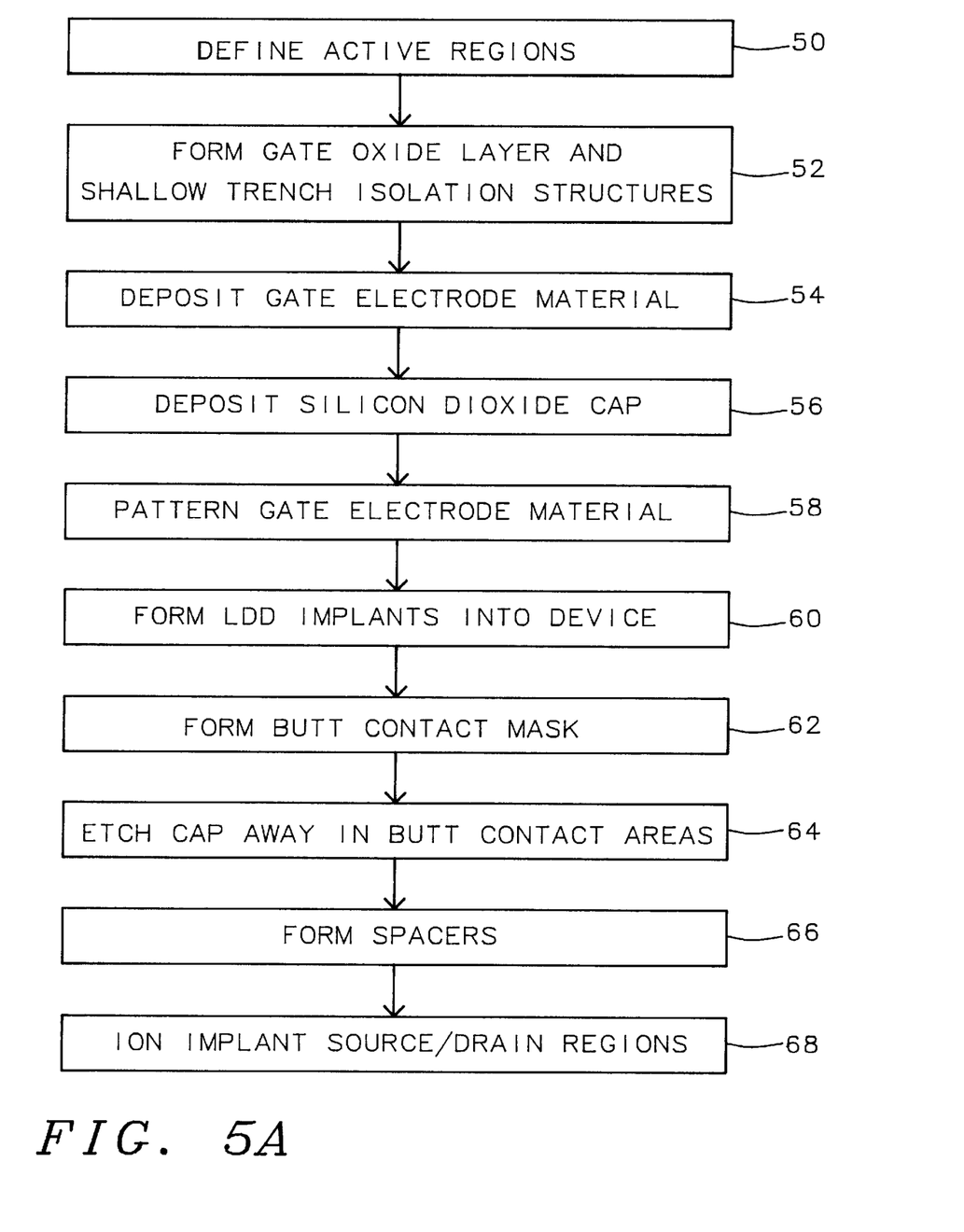
FIGS. 5A and 5B show a flow chart for the method of manufacture of a device in accordance with this invention.

Next, in step 52 in FIG. 5A, a Shallow Trench Isolation (STI) process has been performed to form STI trenches in the substrate 31. The trenches are filled with silicon dioxide STI region 33A in FIG. 2A and STI regions 33B and 33C in FIG. 3A, in accordance with STI process steps well known to those skilled in the art. Alternatively a LOCOS (LOCal Oxidation of Silicon) process can be used. Relative to STI and LOCOS processes, see Wolf, "Silicon Processing for the VLSI Era Vol. 3-The Submicron MOSFET", Pages 330–420.

In the process a gate oxide layer 32 is formed during the STI or LOCOS process on the remaining surface of the substrate 31, as is usual.

Next, in step 54 of FIG. 5A, as shown in FIGS. 2A and 3A, a blanket of gate conductor electrode layer G1/G2/G3/G4 was deposited over the silicon dioxide STI/LOCOS structures 33A, 33B, 33C and gate oxide layer 32. The gate conductor material comprises ether doped polysilicon or doped polycide/doped polysilicon with a thickness from about 1500 Å to about 3500 Å.

Referring again to FIGS. 2A and 3A, in step 56 a hard mask has been formed as a silicon dioxide cap layer OX1/OX2/OX3/OX4 deposited over the blanket gate conductor electrode layer G1/G2/G3/G4. The silicon dioxide cap (hard mask) layer OX1/OX2/OX3/OX4 is formed by a conventional CVD (Chemical Vapor Deposition) TEOS (Tetra-Ethyl-Ortho Silicate) process which is selected from Plasma Enhanced CVD TEOS (PECVD TEOS) or Low Pressure CVD TEOS (LPCVD TEOS) process with a thickness from about 1,000 Å to about 2,500 Å.

In step 58 a gate conductor mask has been formed over the gate conductor electrode layer and the silicon dioxide cap.

Then etching through the mask has formed the four gate electrode stacks G1/OX1, G2/OX2, G3/OX3, and G4/OX4 as seen in FIG. 2A.

In step 60, in FIG. 5A as shown in FIG. 2A, the Lightly Doped Drain & source (LDD) process was performed with N-LDD regions formed in a P-Substrate as shown in FIG. 2A or the alternative of P-LDD regions in the N-Substrate, not shown herein. The NLDD P31 or As dopant is applied in a range from about 1E13 ions/cm$^{-2}$ to about 1E14 ions/cm$^{-2}$ at an energy from about 20 keV to about 50 keV. The PLDD BF$_2$ dopant is applied in a range from about 1E13 ions/cm$^{-2}$ to about 1E14 ions/cm$^{-2}$ at an energy from about 20 keV to about 50 keV.

In step 62 (FIG. 2B) a Butt Contact (BC) mask PR1 with an opening W1 is formed over the device of FIG. 2A.

In step 64 of FIG. 5A (FIG. 2C) the Butt Contact (BC) region (of the device of FIG. 2B) has been patterned by etching away the left portion of the silicon dioxide cap OX2 exposed through the opening W1 in mask PR1, leaving the upper surface of gate electrode G2 exposed. In the case of FIG. 3C, the cap OX2 is shown etched away on the right, and there is a trough 37 etched down into the STI region 33C to the right of gate electrode G2. Then the mask PR1 is stripped away from the device 30 leaving the four gate electrode stacks G1/OX1, G2/OX2, G3/OX3, and G4/OX4 exposed.

In step 66, in FIG. 5A as shown in FIGS. 2D and 3D, the device of FIG. 2C is shown after silicon dioxide spacers 38 have been formed in accordance with the well known spacer formation process steps of deposition of silicon dioxide and etching back the silicon dioxide layer with a dry etching (RIE) process. Note that the spacers 38 are formed on both ends of gate electrode G2 and on all sidewalls of cap oxide layer OX2, but a portion of the top surface of gate conductor G2 remains exposed, whereas the top surfaces and sidewalls of remaining gate conductors G1, G3 and G4 are encapsulated by the caps OX1, OX3 and OX4, as well as, the spacers 38 juxtaposed therewith. Also, the spacer 38 in trough 37 leaves a smaller trough 371 between gate electrode G2 and STI region 33C.

In step 68, in FIG. 5A, as shown a set of N+ source/drain regions S/D 35A, 35B, 35C, and 35D in FIG. 2D, are being formed in the P-substrate 31 between and adjacent to the spacers 38. Also, as shown in FIG. 3E, an N+ source/drain region 35E is being formed between STI region 33B and a spacer 38 in the P-substrate 31. In FIG. 3D, it should be noted that between gate electrode G2 and STI region 33C to the right there are no source/drain regions shown in the P-substrate 31 since the structure does not provide a window down to the substrate and the spacer 38 to the right of gate G2 extends down into the trough 37 formed to the right of the gate G2 blocking ion implantation into the substrate 31 there. In the case of an N-type doped substrate, then the ion implant will be a P+ dopant comprising BF$_2$ ions applied in a range from about 2E15 ions/cm$^{-2}$ to about 6E15 ions/cm$^{-2}$ at an energy from about 20 keV to about 60 keV. In the case of an P-type doped substrate, then the ion implant will be a N+ dopant comprising As ions applied in a range from about 2E15 ions/cm$^{-2}$ to about 6E15 ions/cm$^{-2}$ at an energy from about 25 keV to about 80 keV.

Figure 5B:
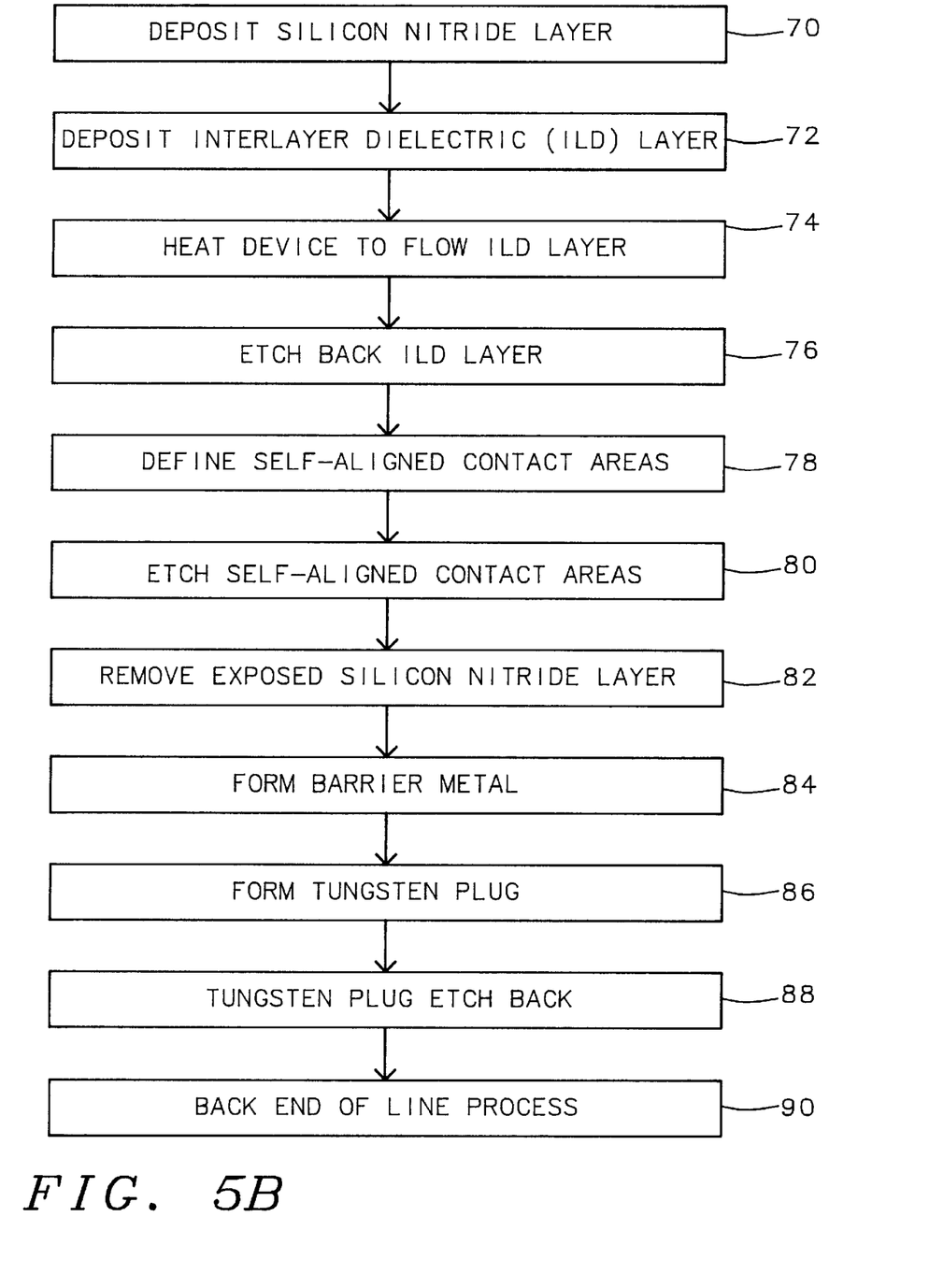

In step 70, in FIG. 5B as shown in FIGS. 2F and 3F a blanket silicon nitride (Si$_3$N$_4$) etch stop layer 40 has been formed over the device 30 with a thickness from about 200 Å to about 600 Å.

Referring to FIGS. 2F and 3F, the device of FIGS. 2E and 3E is shown after formation over device 30 of a blanket Inter Layer Dielectric layer ILD composed of a PECVD TEOS glass layer with a thickness from about 1,000 Å to about 2,000 Å and a Boron Phosphorus TEOS glass layer with a thickness from about 3,000 Å to about 12,000 Å. (See Wolf, "Silicon Processing for the VLSI Era Vol. 2-Process Integration", (1990) Pages 195–196. Also see commonly assigned, U.S. Pat. No. 5,631,179 based upon application Ser. No. 08/511,062 filed Aug. 3, 1995 of H. C. Sung and L. Chen for "Method of Manufacturing Metallic Source Line, Self-Aligned Contact and Device Manufactured Thereby".

Referring again to FIGS. 2F and 3F, and to step 74, the device 30 is shown after heating the device to planarized the layer ILD by heating from about 750° C. to about 900° C. Next, as shown in step 76, there is an etch back of layer ILD to further planarize the layer ILD producing a thickness of layer ILD from about 2,000 Å to about 6,000 Å.

In step 78 a mask PR2 with windows W4 (FIG. 3F) and windows W3, W4, W5, and W6 (FIG. 2F) therethrough is formed over layer ILD to define Self-Aligned Contact (SAC) areas to source/drain regions 35A, 35B, 35C, 35D and 35E and to the gate conductor G2 to connect source and drain SAC areas and the butted contact BC1.

Referring to FIGS. 2G and 3G the device 30 of FIG. 2F and FIG. 3F is shown after performance of the etching step 80 (FIG. 5B) to form SAC areas wherein the device 30 has been etched the exposed portions of layer ILD through windows W3, W4, W5, and W6 in mask PR2 down to silicon nitride etch stop layer 40 to form openings spaces W3', W4', W5', and W6' to expose the SAC regions. The opening W4' through window W4 prepares for formation of a Self Aligned BuTted Contact (SABTC), in accordance with this invention, at the left end of gate electrode G2. This provides for the SAC (ILD) etching with silicon nitride ($Si_3N_4$) layer 40 providing the etch stop.

FIGS. 2H and 3H show the device of FIGS. 2G and 3G after the removal of silicon nitride layer 40 by dry etching with an etching gas such as $CHF_3$ and Oxygen ($O_2$). This leaves the surface of gate G2 exposed through opening space W4' enabling the formation of a butted contact BC1 thereto. It also exposes the surfaces of the N+ Source/Drain regions 35A, 35B, 35C, and 35D to provide the basis for forming SAC contacts therewith in succeeding manufacturing steps.

FIGS. 2I and 3I show the device of FIGS. 2H and 3H after the step 84 comprising formation of a pair of barrier metal—titanium and titanium nitride—layers 42 on the exposed surfaces of the substrate 31 and the sidewalls of layer ILD which are exposed. The barrier layers 42 are formed by formation of titanium to a thickness of about 300 Å covered with a layer of TiN to a thickness of about 1,000 Å.

Then in step 86 within the spaces defined by the barrier metal layers 42 are formed a set of tungsten plugs PL1, PL2, PL3 and PL4 which connect respectively to N+ Source/Drain regions 35A, 35B, 35C, and 35D and in the case of plug PL2, the lower right surface of the plug is in electrical and mechanical contact with gate G2 forming the SABTC contact adjacent to and in contact with gate G2 in accordance with this invention. The plugs PL1, PL2, PL3 and PL4 are formed by depositing a blanket layer of tungsten filling spaces W3', W4', W5', and W6'. The blanket tungsten layer is deposited to a thickness of about 5,000 Å above the surface of the device followed by etching back 5,000 Å leaving the plugs in the spaces W3', W4', W5', and W6' formed below windows W3, W4, W5, and W6 with a planarized surface with the tungsten plugs PL1, PL2, PL3 and PL4 planarized to be level with the substrate surface.

The combination of a Butted-contact with the SAC process results in a structure which take up less space which can also to connect drains of the pull down device and the gate of another pull down and pull up (PMOS) transistors.

Referring to step 88, the tungsten (W) plugs PL1, PL2, PL3 and PL4 are etched back to the surface of the Inter Layer Dielectric layer ILD.

In step 90, the back end of the line process steps are performed including defining Metal-1, forming vias, defining Metal-2 and forming passivation areas (include sputtering, photolithography and etching).

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by letters patent is as follows:

1. A method of forming a contact between a conductor and a substrate region in a MOSFET device comprising:

forming a semiconductor substrate with a silicon oxide layer formed on the surface thereof, forming a stack of a conductor material upon the surface of the silicon oxide layer and forming a first dielectric layer upon the conductor material, patterning the conductor stack into conductors, forming a butted contact pattern in the first dielectric layer by removal of the dielectric layer in at least one butted contact region, forming doped regions in the substrate self-aligned with the conductors, forming a second dielectric layer over the device and patterning the second dielectric layer with contact openings therethrough down to the substrate and to the butted contact region, forming contacts to the substrate and the butted contact regions on the conductor through the contact openings.

2. A method in accordance with claim 1 including the steps of as follows:

forming an etch stop layer over the device before forming the second dielectric layer, employing the etch stop layer when patterning the second dielectric layer, and removing exposed portions of the etch stop layer subsequent to patterning the second dielectric layer.

3. A method in accordance with claim 1 wherein the first dielectric layer is a silicon dioxide cap.

4. A method in accordance with claim 1 including the steps of as follows:

forming a barrier layer in the contact openings prior to forming the contacts, and forming the contacts on the surfaces of the barrier layer.

5. A method in accordance with claim 1 including the steps of as follows:

forming the first dielectric layer as a silicon dioxide cap, forming an etch stop layer over the device before forming the second dielectric layer, employing the etch stop layer when patterning the second dielectric layer, and removing exposed portions of the etch stop layer subsequent to patterning the second dielectric layer.

6. A method in accordance with claim 5 including the steps of as follows:

forming a barrier layer in the contact openings prior to forming the contacts, and forming the contacts on the surfaces of the barrier layer.

7. A method in accordance with claim 5 including the steps of as follows:

forming lightly doped regions in the substrate and then forming spacer structures adjacent to the conductors prior to forming the doped regions in the substrate.

8. A method in accordance with claim 7 including the steps of as follows:

forming the first dielectric layer as a silicon dioxide cap, forming an etch stop layer over the device before forming the second dielectric layer, employing the etch stop layer when patterning the second dielectric layer, and removing exposed portions of the etch stop layer subsequent to patterning the second dielectric layer.

9. A method in accordance with claim 8 including the steps of as follows:

forming a barrier layer in the contact openings prior to forming the contacts, and forming the contacts on the surfaces of the barrier layer.

10. A method of forming a contact between a conductor and a substrate region in a MOSFET device comprising:

forming a semiconductor substrate with a silicon oxide layer formed on the surface thereof and Shallow Trench Isolation (STI) regions in the surface of the substrate, forming a stack of a conductor material upon the surface of the silicon oxide layer and forming a first dielectric layer upon the conductor material, patterning the conductor stack into conductors with at least one thereof juxtaposed with a first STI region, forming a butted contact pattern in the first dielectric layer by removal of the dielectric layer in at least one butted contact region juxtaposed with an STI region, forming doped regions in the substrate self-aligned with the conductors with at least one butted with a the conductor to form a butted contact region, forming a second dielectric layer over the device and patterning the second dielectric layer with contact openings therethrough down to the substrate and to the butted contact region, forming contacts to the substrate and the butted contact regions on the conductor through the contact openings.

11. A method in accordance with claim 10 including the steps of as follows:

forming an etch stop layer over the device before forming the second dielectric layer, employing the etch stop layer when patterning the second dielectric layer, and removing exposed portions of the etch stop layer subsequent to patterning the second dielectric layer.

12. A method in accordance with claim 10 wherein the first dielectric layer is a silicon dioxide cap.

13. A method in accordance with claim 10 including the steps of as follows:

forming a barrier layer in the contact openings prior to forming the contacts, and forming the contacts on the surfaces of the barrier layer.

14. A method in accordance with claim 10 including the steps of as follows:

forming the first dielectric layer as a silicon dioxide cap, forming an etch stop layer over the the device prior to forming the second dielectric layer, employing the etch stop layer when patterning the second dielectric layer, and removing exposed portions of the etch stop layer subsequent to patterning the second dielectric layer.

15. A method in accordance with claim 13 including the steps of as follows:

forming a barrier layer in the contact openings prior to forming the contacts, and forming the contacts on the surfaces of the barrier layer.

16. A method in accordance with claim 13 including the steps of as follows:

forming lightly doped regions in the substrate and then forming spacer structures adjacent to the conductors prior to forming the doped regions in the substrate.

17. A method in accordance with claim 16 including the steps of as follows:

forming the first dielectric layer as a silicon dioxide cap, forming an etch stop layer over the device prior to forming the second dielectric layer, employing the etch stop layer when patterning the second dielectric layer, and removing exposed portions of the etch stop layer subsequent to patterning the second dielectric layer.

18. A method in accordance with claim 17 including the steps of as follows:

forming a barrier layer in the contact openings prior to forming the contacts, and forming the contacts on the surfaces of the barrier layer.

* * * * *